United States Patent [19]
Houdeau et al.

[11] Patent Number: 5,982,628
[45] Date of Patent: Nov. 9, 1999

[54] CIRCUIT CONFIGURATION HAVING A SMART CARD MODULE AND A COIL CONNECTED THERETO

[75] Inventors: Detlef Houdeau, Langquaid; Josef Mundigl, Duggendorf, both of Germany

[73] Assignee: Siemens Aktiengesellschaft, Munich, Germany

[21] Appl. No.: 08/812,112

[22] Filed: Mar. 5, 1997

Related U.S. Application Data

[63] Continuation of application No. PCT/DE95/01199, Sep. 5, 1995.

[30] Foreign Application Priority Data

Sep. 5, 1994 [DE] Germany ............................. 44 31 604

[51] Int. Cl.⁶ ............................................... H05K 1/18
[52] U.S. Cl. .................... 361/760; 361/761; 361/764; 361/772; 361/774; 361/777; 361/807; 361/809; 361/813; 361/820; 235/380; 235/381; 235/382; 235/487; 257/679; 257/684; 257/687; 257/690; 257/692
[58] Field of Search ...................... 361/760, 761, 361/765, 764, 772, 773, 774, 777, 778, 803, 807, 809, 813, 820; 257/679, 723, 724, 687, 684, 690, 692, 728, 729, 730, 735; 235/380, 381, 382, 487

[56] References Cited

U.S. PATENT DOCUMENTS

| 4,692,604 | 9/1987 | Billings ........................................ 235/493 |
| 5,412,192 | 5/1995 | Hoss ............................................. 235/380 |
| 5,640,306 | 6/1997 | Gaumet et al. ........................... 361/737 |
| 5,682,296 | 10/1997 | Horejs, Jr. et al. ..................... 361/737 |

*Primary Examiner*—Lynn D. Feild
*Assistant Examiner*—David Foster
*Attorney, Agent, or Firm*—Herbert L. Lerner; Laurence A. Greenberg

[57] ABSTRACT

A circuit configuration includes a planar carrier which has at least two contact lugs. A semiconductor chip which is disposed on the carrier is electrically conductively connected to the insulated contact lugs of the carrier. At least two of the contact lugs are used to connect the semiconductor chip to two ends of a coil. The two contact lugs have different lengths, so that none of the coil ends has to cross the coil winding.

8 Claims, 2 Drawing Sheets

5,982,628

CIRCUIT CONFIGURATION HAVING A SMART CARD MODULE AND A COIL CONNECTED THERETO

CROSS-REFERENCE TO RELATED APPLICATION

This application is a Continuation of International Application Ser. No. PCT/DE95/01199, filed Sep. 5, 1995.

BACKGROUND OF THE INVENTION

Field of the Invention

The invention relates to a circuit configuration having a smart card module and a coil connected thereto.

German Patent DE 30 29 667 C2 shows a circuit configuration in which a flexible, non-conductive sheet is provided on one side with a conductive layer. Recesses are, for example, stamped into the sheet, so that the side of the conductive layer which faces the sheet is accessible through the recesses. The conductive layer is subdivided, for example by etching grooves, into mutually electrically insulated contact regions, with each contact region of the conductive layer being assigned a recess in the sheet. A semiconductor chip which is connected to the contact regions through the use of bonding wires is inserted into one of the recesses, preferably in a central recess. The semiconductor chip and the bonding wires are potted with a protective casting resin. That circuit configuration, which is a so-called carrier element, is inserted into a plastic card, that is alternatively referred to as a smart card, with the contact regions lying approximately in one plane with a smart card surface. As a result of that structure, a reading station can supply power and exchange information with the semiconductor chip through the use of mechanical contacts., A further example of a circuit configuration with contacts is shown by Published European Patent Application 0 254 640 A1. In that example, recesses are stamped into a metal surface so that the recesses define contact regions which are linked only through a frame and are designated as a lead frame. Disposed on a central contact region is a semiconductor chip which is conductively connected to the other contact regions through the use of bonding wires. The configuration is potted with synthetic resin in such a way that only the outwardly pointing parts of the contact regions remain uncovered as contact lugs, are insulated from one another by removing the supporting frame and can serve for making contact with the semiconductor chip.

In the case of the two known circuit configurations, the power needed to supply the semiconductor chip as well as the data flow from and to the semiconductor chip are handled through the contact lugs through the use of mechanical contacts.

German Patent DE 41 15 065 C2 discloses, for example, a device for contactless data and power transmission. In that example, the semiconductor chip is connected to two coils through which data and power are conveyed in a contactless manner, for example through the use of transformer transmission.

Such smart cards containing circuit configurations with coils are manufactured in large numbers. It is therefore necessary to use a method for their manufacture which is fast, inexpensive and can be automated, though it does necessitate the use of a suitable structure of the circuit configuration.

It has emerged from analyses of previous concepts using contactless smart cards that in those cases the ends of the coil are arbitrarily routed, and crossed over the coil, to connection points at the semiconductor chip, although that is disadvantageous for automation since a coil end crosses over the coil at any point. Such a coil having an increasing thickness is unfavorable, since the cover layers of the card have to compensate for the unfavorable height levels, resulting in some cases in severe changes in shape of the PVC plastic sheets. Since the cover layers are generally provided with print which is visible to the user, that is to say they represent a design part and local deformations in the region of the coil crossing points, which have an undefined location, can lead to undefined print distortions.

SUMMARY OF THE INVENTION

It is accordingly an object of the invention to provide a circuit configuration having a smart card module and a coil connected thereto, which overcomes the hereinaforementioned disadvantages of the heretofores-known devices of this general type and which can be produced simply, cost-effectively and in a manner allowing easy automation.

With the foregoing and other objects in view there is provided, in accordance with the invention, a circuit configuration, comprising a planar carrier forming a lead frame having at least two mutually insulated contact lugs; a semiconductor chip disposed on the planar carrier and electrically conductively connected to the contact lugs; and a coil having windings and two ends; at least two of the contact lugs connecting the semiconductor chip to the two ends of the coil, the at least two contact lugs having different lengths, so that none of the coil ends has to cross the coil winding.

With the objects of the invention in view, there is also provided a circuit configuration, comprising a planar carrier formed of a flexible, non-conductive sheet having a conductive layer, the planar carrier having first and second opposite sides and at least two mutually insulated contact lugs disposed on the first side and formed by structures etched from the conductive layer; a semiconductor chip disposed on the planar carrier and electrically conductively connected to the contact lugs through recesses formed in the sheet; and a coil having windings and two ends guided from the second sided of the sheet through recesses in the sheet; at least two of the contact lugs connecting the semiconductor chip to the two ends of the coil, the at least two contact lugs having different lengths, so that none of the coil ends has to cross the coil winding.

As a result of the circuit configuration according to the invention, it is unnecessary for a coil end to have to cross the winding of the planar coil, that is to say it provides a coil in which the turns do not overlap but rather are situated alongside one another, with the result that the coil end cannot assume an undefined position. It is thus possible to achieve a clear, geometrically definable field line formation even in the region of the coil ends.

The necessary bridging is effected through the use of the longer of the two contact lugs of the circuit configuration. In this case, the planar carrier can be a lead frame or a metal-coated sheet, for example a copper laminated glass epoxide.

In accordance with another feature of the invention, the contact lugs have ends forming a Large-area contact region. The widened ends of the contact lugs enable easier connection between the coil ends and the contact lugs.

The coil normally has a cross-sectional area which approximately corresponds to the dimensions of a smart card.

In accordance with a further feature of the invention, the contact regions contacting the coil ends are disposed on the sheet with no sheet border at least in a guide direction of one of the coil ends.

In accordance with an added feature of the invention, there is provided a protective plastics compound surrounding the semiconductor chip and connections to the contact lugs.

In accordance with an additional feature of the invention, the coil has a substantially rectangular shape.

In accordance with yet another feature of the invention, the coil has a corner in which the semiconductor chip is disposed. It is preferable to place the semiconductor chip in a corner of the coil, and therefore of the smart card, since that is where the bending load is lowest for the IC.

In accordance with yet a further feature of the invention, the at least two contact lugs are mutually parallel.

In accordance with yet an added feature of the invention, the at least two contact lugs are mutually perpendicular.

In accordance with a concomitant feature of the invention, the at least two contact lugs are disposed on opposite sides of the semiconductor chip.

Other features which are considered as characteristic for the invention are set forth in the appended claims.

Although the invention is illustrated and described herein as embodied in a circuit configuration having a smart card module and a coil connected thereto, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description o of specific embodiments when read in connection with the accompanying drawings.

DESCRIPTION OF THE PREFERRED EMBODIMENTS

Figure 1:
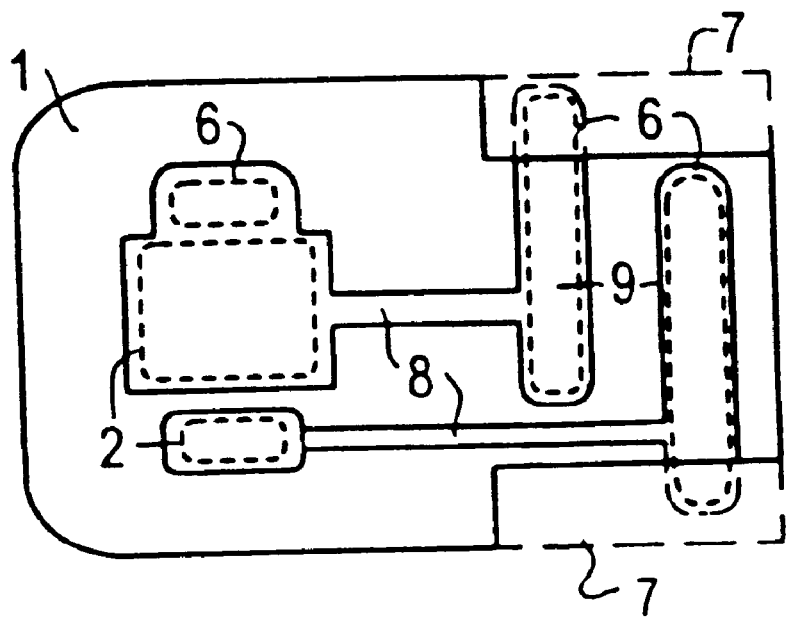
FIG. 1 is a diagrammatic, bottom-plan view of a planar carrier showing a structure of contact regions and of contact lugs as well as a top surface illustrated. in broken lines.

Referring now to the figures of the drawings in detail and first, particularly, to FIG. 1 thereof, there is seen a first embodiment of a planar carrier for a circuit configuration according to the invention. The planar carrier includes a flexible, non-conductive sheet 1, for example a glass epoxide lamina, which is provided on a first side with contact regions 2 and contact lugs 8 connected thereto that have widened ends 9. In this case, the contact regions 2 and contact lugs 8 with their widened ends 9 are produced, for example through the use of an etching operation, from a metal sheet, for example a copper sheet, which is laminated onto the sheet 1. Regions 6 are illustrated by broken lines in FIG. 1 which is intended to indicate that they are seen from the other side of the sheet. In this case, there are recesses in the sheet 1, through which the sides of the contact region 2 and the contact lugs 8 having the widened ends 9 which face the sheet become accessible. A further configuration of the sheet 1 is indicated by broken lines 7 in FIG. 1. The configuration of the sheet 1 which is illustrated by a continuous line has the advantage of having a recess in the sheet which is not completely closed, with the result that a coil end can be secured more Easily from that side.

Figure 2:
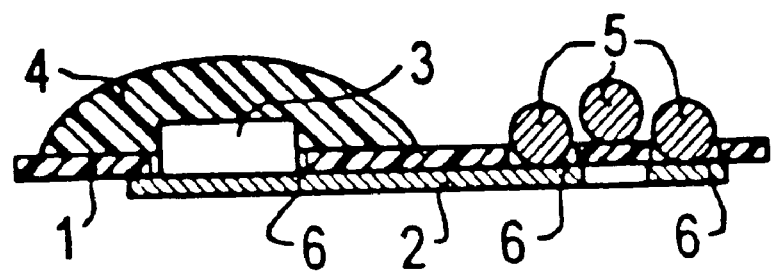
FIG. 2 is a cross-sectional view of the planar carrier of FIG. 1 with a potted semiconductor chip and a coil turn.

FIG. 2 shows a cross-section through a planar carrier such as the one illustrated in FIG. 1. In this case a semiconductor chip 3 is inserted into one of the recesses 6. This semiconductor chip 3 as well as its electrical connections to the contact region, which are not illustrated herein, are covered by a casting resin 4. Coil turns 5 which can also be seen are disposed on a second side of the sheet 1 and include two outer turns that are secured, for example soldered, in and pass through recesses of the widened ends 9 of the contact lug 8. The use of a shorter and a longer contact lug 8 according to the invention means that the coil can be wound without any cross-overs, with the result that its ends have a defined position with respect to one another as well as with respect to the semiconductor chip. This configuration permits manufacturing which can easily be automated, is fast and is cost-effective.

Figure 3:
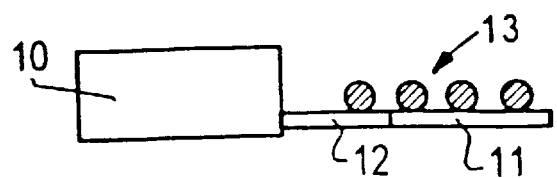
FIG. 3 is a partly-sectional, side-elevational view of a circuit configuration using lead frame technology and potted with synthetic resin.
Figure 4:
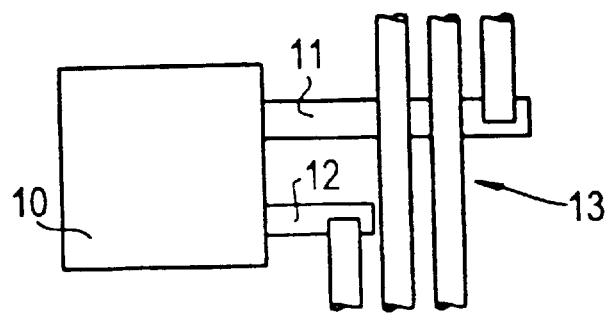
FIG. 4 is a fragmentary, plan view of the circuit configuration according to FIG. 3.

FIGS. 3 to 6 show further embodiments of a circuit configuration according to the invention using lead frame technology. In this case, a non-illustrated semiconductor chip as well as contact region are potted in a housing 10. In accordance with FIGS. 3 and 4, two contact lugs 11 and 12 extend parallel and one contact lug 11 is longer than the other contact lug 12. In this case, FIG. 3 shows a side view and FIG. 4 shows a plan view of such a circuit configuration. Coil turns 13 of a planar coil can also be seen there. As is clear to see, the coil can be constructed without any cross-overs because of the different lengths of the contact lugs according to the invention.

Figure 5:
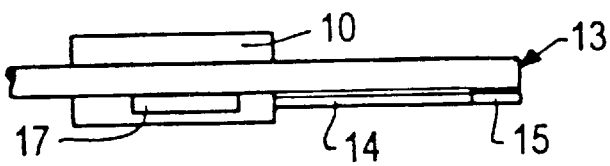
FIG. 5 is a fragmentary, side-elevational view of a circuit configuration which uses lead frame technology, is potted with synthetic resin and has contact lugs disposed perpendicularly with respect to one another.
Figure 6:
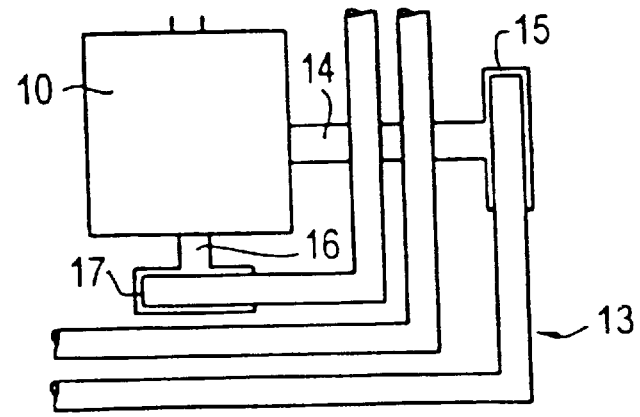
FIG. 6 is a fragmentary, plan view of a circuit configuration according to FIG. 5.

FIG. 5 shows a side view and FIG. 6 shows a plan view of a further embodiment using lead frame technology of a circuit configuration according to the invention. Two contact lugs 14, 16, which are disposed perpendicularly with respect to one another, project from a housing 1.0 in which a semiconductor chip as well as associated contact regions are potted. In this case, the contact lugs have widened ends 15, 17 on which ands of a coil 13 can be secured, for example soldered. This refinement of a circuit configuration enables the latter to be disposed with particular ease in a corner of the coil.

We claim:

1. A circuit configuration, comprising:

a planar carrier forming a leaf, frame having at least two mutually insulated contact lugs;

a semiconductor chip disposed on said planar carrier and electrically conductively connected to said contact lugs; and a coil having windings and two ends;

at least two of said contact lugs connecting said semiconductor chip to said two ends of said coil, said at least two contact lugs having different lengths, and none of said coil ends crossing said coil winding.

2. The circuit configuration according to claim 1, wherein said contact lugs have widened ends forming a contact region.

3. The circuit configuration according to claim 1, including a protective plastics compound surrounding said semiconductor chip and connections to said contact lugs.

4. The circuit configuration according to claim 1, wherein said coil has a substantially rectangular shape.

5. The circuit configuration according to claim 4, wherein said coil has a corner in which said semiconductor chip is disposed.

6. The circuit configuration according to claim 1, wherein said at least two contact lugs are mutually parallel.

7. The circuit configuration according to claim 1, wherein said at least two contact lugs are mutually perpendicular.

8. The circuit configuration according to claim 1, wherein said at least two contact lugs are disposed on opposite sides of said semiconductor chip.

\* \* \* \* \*